(12) United States Patent
Seidemann (10) Patent No.: US 10,546,826 B2
(45) Date of Patent: Jan. 28, 2020

(54) DEVICE CONTAINING AND METHOD OF PROVIDING CARBON COVERED COPPER LAYER

(71) Applicant: Intel IP Corporation, Santa Clara, CA (US)

(72) Inventor: Georg Seidemann, Landshut (DE)

(73) Assignee: Intel IP Corporation

( * ) Notice: Subject to any disclaimer, the term of this patent is extended or adjusted under 35 U.S.C. 154(b) by 0 days.

(21) Appl. No.: 16/025,575

(22) Filed: Jul. 2, 2018

(65) Prior Publication Data
US 2020/0006263 A1 Jan. 2, 2020

(51) Int. Cl.
*H01L 23/00* (2006.01)
*H01L 23/29* (2006.01)
*H05K 1/09* (2006.01)

(52) U.S. Cl.
CPC .............. *H01L 24/02* (2013.01); *H01L 23/29* (2013.01); *H01L 24/13* (2013.01); *H05K 1/09* (2013.01); *H01L 2224/0226* (2013.01); *H01L 2224/0231* (2013.01); *H01L 2224/02251* (2013.01); *H01L 2224/10145* (2013.01); *H01L 2224/13024* (2013.01); *H05K 2201/10234* (2013.01)

(58) Field of Classification Search
CPC ......... H01L 24/02; H01L 23/29; H01L 24/13; H01L 2224/10145; H01L 2224/0231; H01L 2224/13024; H01L 2224/0226; H01L 2224/02251; H05K 1/09; H05K 2201/10234

See application file for complete search history.

(56) References Cited

U.S. PATENT DOCUMENTS

| | | | | |
|---|---|---|---|---|
| 2002/0027286 A1* | 3/2002 | Sundararajan | ........ | H01L 21/314 257/751 |
| 2002/0177303 A1* | 11/2002 | Jiang | ................. | H01L 21/76844 438/653 |
| 2003/0042613 A1* | 3/2003 | Shioya | .................. | C23C 16/401 257/762 |
| 2006/0079025 A1* | 4/2006 | Kripesh | .............. | H01L 23/3185 438/113 |
| 2015/0371960 A1* | 12/2015 | Yap | ......................... | H01L 23/66 257/659 |

* cited by examiner

*Primary Examiner* — Karen Kusumakar
(74) *Attorney, Agent, or Firm* — Schwegman Lundberg & Woessner, P.A.

(57) ABSTRACT

A device and method of preventing corrosion of a copper layer in a PCB is disclosed. A first dielectric is disposed on a substrate. A copper layer is plated in an opening in the first dielectric and, after conditioning the copper layer, a redistribution layer is plated on the copper layer. A solder resist layer is disposed above the copper layer. A solder ball is disposed in an opening in the solder resist layer. The solder ball is in conductive contact with the copper layer and in physical contact with the redistribution layer. A non-conductive carbon layer is disposed on and in contact with the redistribution layer or tsi-diehe solder resist layer. The carbon layer is substantially thinner than the copper layer and acts as a diffusion barrier to moisture for the copper layer.

20 Claims, 10 Drawing Sheets

DEVICE CONTAINING AND METHOD OF PROVIDING CARBON COVERED COPPER LAYER

TECHNICAL FIELD

This disclosure relates generally to processing of electronic devices. Some embodiments are related to passivation of a copper layer during processing. Some embodiments are related to electronic devices that comprise a passivated copper layer.

BACKGROUND

Electronic devices continue to permeate every aspect of daily life. Along with increased use, the demand for devices with more powerful and complex circuitry continues unabated. Redesign of the traces during fabrication may be used to create such circuitry, as well as developing chemistry and lithographic processes for decreased linewidths during semiconductor fabrication. Protection may be employed to preserve the conductive materials used for the traces, both during and after fabrication of the electronic device. However, the current protection may be insufficient, and thus alternative methods of protecting at least some of the conductive materials may be desirable.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As above, during fabrication, some conductive layers may be protected from corrosion through self-passivation layers. Aluminum (Al) and Al alloys, among others, may exhibit self-passivation. Such metals may form protective barriers about 3 nm thick. For other conductive layers such as copper (Cu), active measures may be taken to protect the other conductive layers against corrosion as the other conductive layers may not exhibit self-passivation. The active measures may include use of a TaN or TiW liner or nitride caps at the back end of the processing line and may be undertaken to protect the Cu layer against moisture both during and after processing. In other situations, such as printed circuit board (PCB) and packaging technologies liners may not be used. In such scenarios, the use of a dielectric to cover the copper layer and protect against moisture may be desired. At present, however, the dielectrics available during processing do not act as a diffusion barrier against moisture; available dielectrics merely slow down the diffusion of the moisture into the copper layer, leading inevitably to electrical and/or mechanical failure by oxidation. In addition, dielectrics may not be able to be used for various mechanical and material parameters and process conditions in certain packages, e.g., those employing Wafer Level Ball Grid Array (WLB), Embedded Wafer Level Ball Grid Array (eWLB). Flip-Chip (FC) bonding or dies in embedded packages. The use of dielectrics may also be problematic for certain printed circuit boards (PCB) and substrates, which use, e.g., Cu lines similar to packages, and also interconnect elements such as landing pads, Cu-posts and wirebond pads.

Instead or in addition to copper line conditioning such as the use of the liner or caps, an additional layer of protective material may be deposited on the copper as a diffusion interlayer for corrosion prevention or as a moisture barrier. In some embodiments, the protective material may be a carbon layer. The carbon layer may be about 10-40 nm thick. This may enable the elimination of conditioning steps to prevent oxidation of the copper, which may be beneficial due to the risk of delamination and corrosion when testing working conditions by temperature cycling and temperature-humidity bias (THB).

The additional layer of protective material may be used for moisture protection in various locations in different packages. For example, the protective material may be used at Cu lines, landing pads, Cu posts, wirebond pads, solder balls, solder bumps etc. The protective material may be provided in WLB, eWLB, FC, embedded packages or laminate packages, among others. Moreover, the protective material may be used to protect the Cu lines and/or pads on substrates (e.g., Si) or printed circuits boards (PCB). Such a protection layer may be disposed on conformal shielding for laminate packages and modules in other embodiments.

The carbon layer may, in some embodiments, be homogenous and may operate as an adhesion promoter (in addition to preventing corrosion and acting as a diffusion barrier) for a dielectric deposited on the copper layer immediately after the carbon layer. The carbon layer may be fabricated to completely envelope the exposed copper line, and, if desired can be removed via reactive ion etching. The carbon layer may prevent moisture from contacting the copper.

In some embodiments, the carbon layer may also be used to cover the underlying substrate and/or device prior to or after fabricating contact pads on the substrate. In some embodiments, the carbon layer may also be used as a final passivation layer in a front-end process.

Figure 1A:
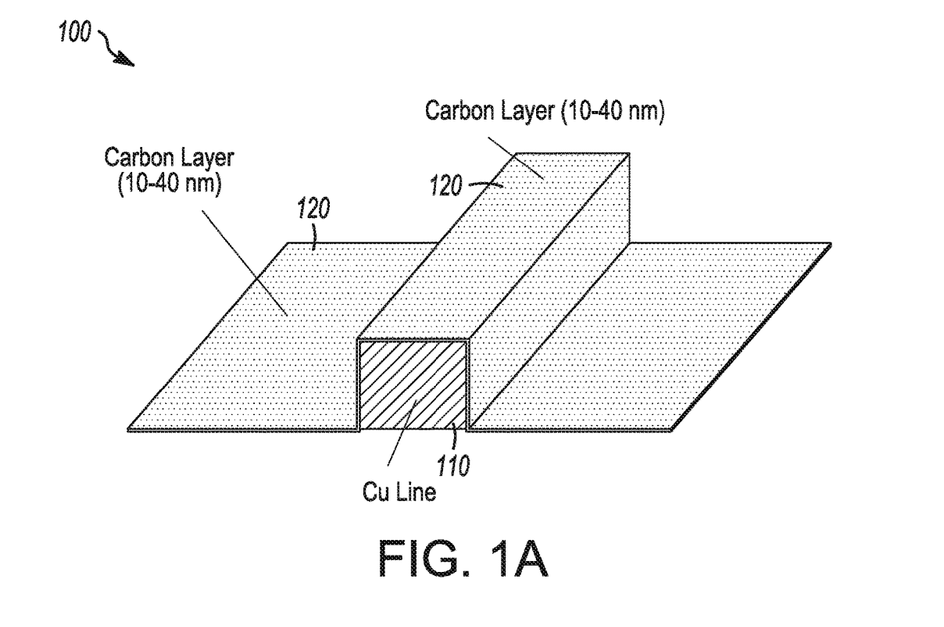
FIGS. 1A-1B illustrate a perspective and cross-sections of a device with protection in accordance with some embodiments.
Figure 1B:
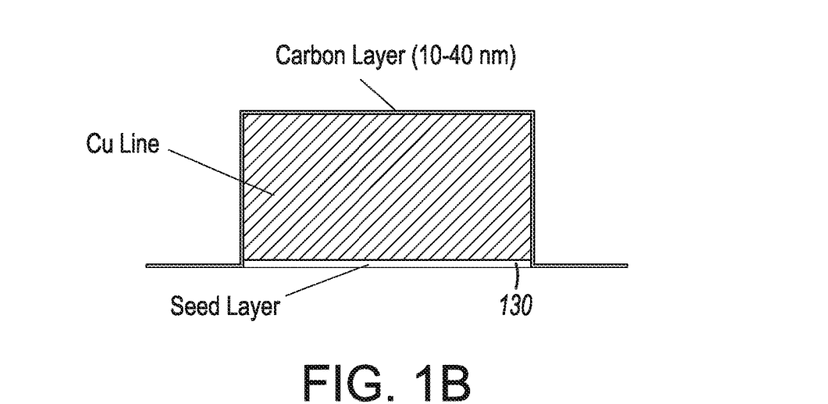

FIGS. 1A-1B illustrate a perspective and cross-section of a device with protection in accordance with some embodiments. The protected line 100 may be provided in an electronic device, such as those described herein. The protected line 100 may include a conductive line 110 and a protective layer 120 as shown in FIG. 1A. The conductive line 110 may be formed from a conductor that does not exhibit self-passivation and that may oxidize or otherwise be detrimentally susceptible to moisture.

In some embodiments, as shown in FIG. 1B, the conductive line 110 may be Cu and may be deposited on a seedlayer 130 on an underlying structure, such as a semiconductor substrate (not shown), insulating mold compound, or dielectric layer, among others. The seedlayer 130 may be a layer of material used to promote adhesion of an overlying conductive layer (e.g., the conductive line 110) in contact with the seed layer 130. The seed layer 130 may be formed from copper or a titanium and tungsten layer with an overlying copper layer, for example. The seed layer 130 may be about 10-15 µm thick, for example.

The protective layer 120 may be a layer of an insulating material that substantially prevents the ingress of moisture to the conductive line 110 surrounded by the protective layer 120. The protective layer may improve adhesion of a layer deposited on the protective layer 120 as well as acting as a diffusion barrier. In addition, the protective layer 120 may be selected from a material that is able to be incorporated in an existing fabrication process. In some embodiments, the protective layer 120 may be a layer of carbon or a non-conductive carbon compound. While conductive protective layers such as Graphene and Fullerene may act as an efficient oxidation barrier for a copper line, such materials may be problematic due to their electrical properties; that is, the protective layer 120 may be limited to a non-conductive protective layer to electrically isolate the copper line 110. Alternatively, one or more non-conductive carbon layers may be used in conjunction with one or more conductive carbon-based layers (e.g., multiple layers of one or both may be present), with the ordering and thicknesses of the different layers dependent on the fabrication process desired and tradeoffs in providing such layers (e.g., resistance vs. fabrication cost and time). In some embodiments, the protective layer 120 may be relatively thin compared with the Cu line 110 and other conductive or insulating layers in the device containing the protected line 100. For example, while the Cu line 110 may be on the order of about 10-30 µm thick, the protective layer 120 may be on the order of several monolayers to tens of monolayers thinner; the protective layer 120 may be about 10-40 nm thick or about 1000× thinner than the Cu line 110. In some embodiments, the protective layer 120 may be substantially thinner than the Cu line 110, where substantially thinner means a thickness of the protective layer 120 is less than about $1/10$ (e.g., $1/10$, $1/100$, $1/1000$) of the thickness of the Cu line 110.

Figure 5:
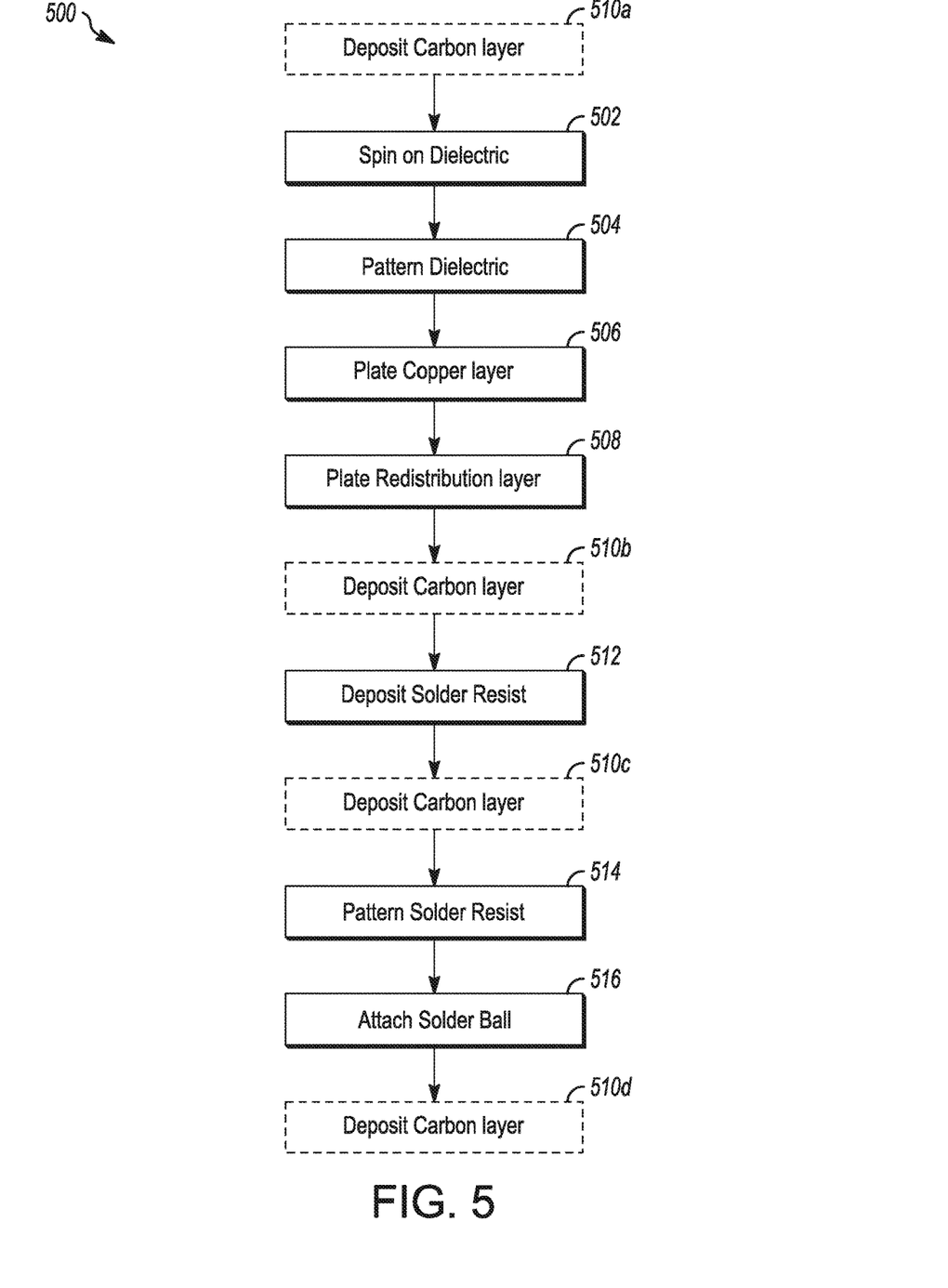
FIG. 5 illustrates a method of forming the device of FIGS. 1-4 in accordance with some embodiments.

FIGS. 2A-2D illustrate cross-section of a device with protection in accordance with some embodiments. FIG. 5 illustrates a method 500 of forming the device of FIGS. 2A-2D in accordance with some embodiments. The device 200 may be an integrated circuit such as a processor, a printed circuit board (PCB), a single wafer or reconstituted wafer for example. FIGS. 2A-2D illustrate examples of cross-sections; in some embodiments, one or more other layers than those shown may be present or one or more layers shown in FIGS. 2A-2D may not be present. For example, there may be multiple conductive and/or dielectric layers disposed between the chip 210 and the solder ball 260. Note that cleaning steps between deposition of various layers may not be used but not described for convenience The device 200 may be fabricated on a chip 210, which may include a semiconductor substrate and/or a mold compound, as above. In some embodiments, contact pads may be deposited and patterned on the chip 210. A dielectric (or dielectric layer) 220 may be spun on at operation 502 and patterned on the chip 210 at operation 504. The patterning of the dielectric 220 (as of the other layers) may use lithographic processes to expose portions of the dielectric 220 and then a wet chemical etch or dry etch such as reactive ion etch to remove the exposed (or non-exposed) portions of the dielectric 220. The dielectric 220 may be on the order of 10-20 µm thick, for instance.

Although not shown for convenience (although shown in FIG. 2B), a seed layer may be deposited on the dielectric 220. The seed layer may be, for example 10-15 µm thick. In some embodiments, the seed layer may be deposited over the entire exposed surface and remain unpatterned. After patterning of the seed layer, photoresist may be spun on and patterned. After patterning of the photoresist, copper may be plated on the exposed seed layer to form a copper line or copper layer 230 at operation 506. Either electroplating or electro-less plating may be used to fabricate the copper layer 220. The copper layer 230 may be, for example, 5-10 µm thick.

Figure 2A:
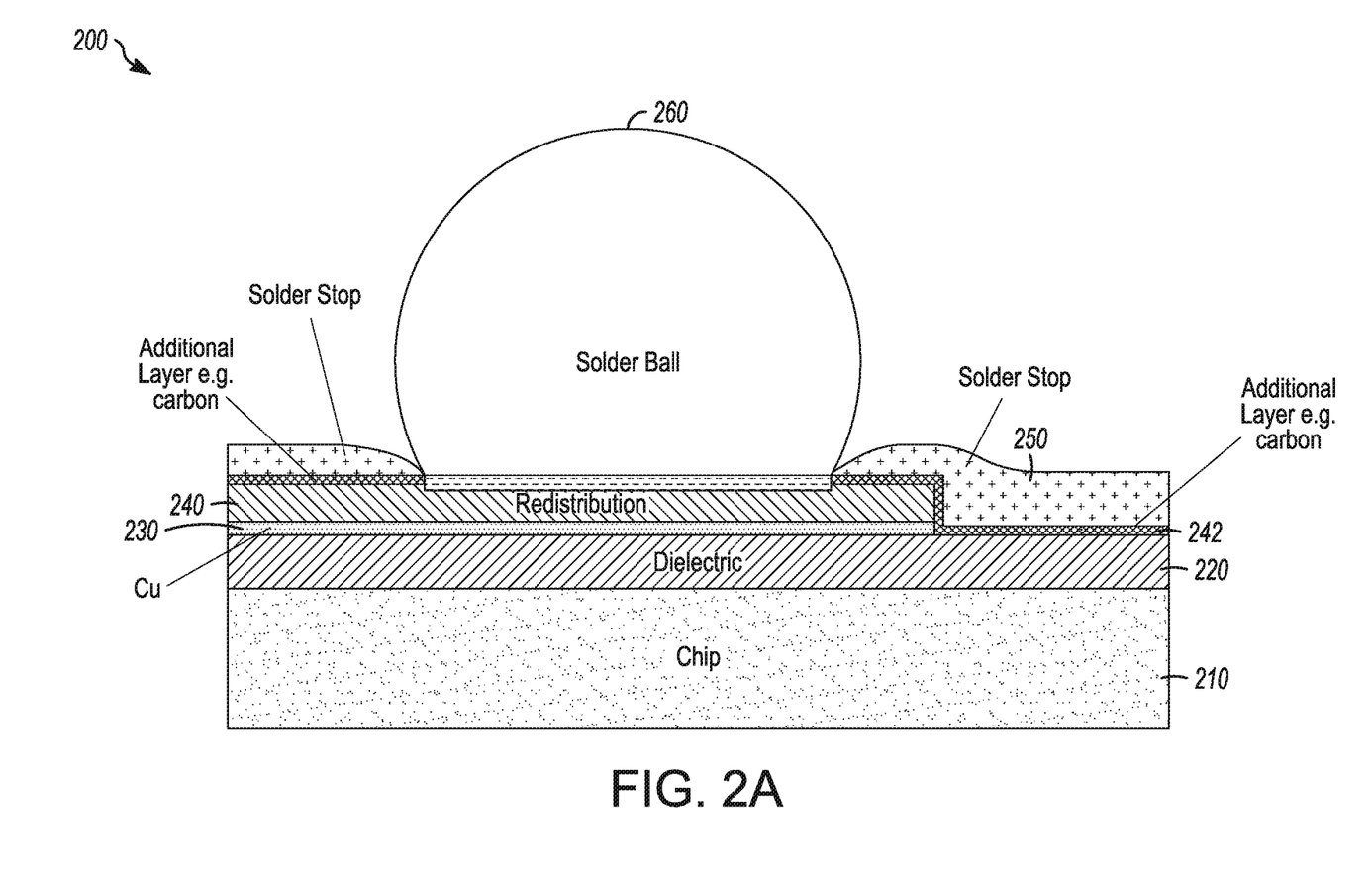
FIGS. 2A-2D illustrate cross-section of a device with protection in accordance with some embodiments.

In some embodiments, the copper layer 230 may be embedded between dielectric layers and used to form conductive traces (e.g., signal or ground routing). As shown, a redistribution layer 240 may then be plated or otherwise deposited on the copper layer 230 at operation 508. The copper layer 230 may be conditioned, e.g. using a plasma to clean the copper layer 230 and permit better adherence of the redistribution layer 240 prior to deposition of the redistribution layer 240. The redistribution layer 240 may extend the copper layer 230 to permit external electrical contact, such as wire bonding, to other areas of the chip 210, making external contact, such as chip-to-chip bonding simpler. The redistribution layer 240 may be formed from Cu or a Cu alloy that is also subject to corrosion.

After the redistribution layer 240 has been provided, the photoresist may be removed. In one example, the photoresist may be removed by a wet chemical etch, for example. After the photoresist has been provided, the exposed seed layer may be removed by wet chemical etch. The etches used as well as the processing conditions (such as time) may, of course, be different due to the different compositions of the different layers. After removal of the seed layer, the additional protective layer 242 may then be deposited over the conditioned copper line at operation 510b using a chemical vapor deposition (CVD) process or other fabrication process. The protective layer 242 may be, for example, a thin carbon layer 10-40 nm thick as described above. In some embodiments, the protective layer 242 may be inert and thus able to be coated over the entire surface of the exposed structure.

After deposition of the protective layer 242, another dielectric 250 may be deposited at operation 512 on the protective layer 242. The other dielectric 250 may then be patterned at operation 514 using lithography. In some embodiments, the other dielectric 250 may be an inner dielectric of the device 200, on which other conductive layers and/or dielectrics are fabricated. In other embodiments, as shown in FIG. 2A, the other dielectric may be a solder stop 250 (or solder mask). In either type of embodiment, the other dielectric 250 may be patterned to have openings through lithographic processes.

When the other dielectric 250 is a solder stop 250, solder balls 260 may be attached at operation 516 to the redistribution layer 240 through the openings in the solder stop 250 through eWLB or other similar processes. In some embodiments, the redistribution layer 240 may be conditioned, for example as above using a plasma to open up the protective layer 242 in the opening and subsequently to clean the redistribution layer 240 after the openings in the solder stop 250 have been created but before attachment of the solder balls 260. In other embodiments, no conditioning of the redistribution layer 240 may be performed after opening the protective layer 242 before attachment of the solder balls 260. Note that although it appears in FIG. 2A that the solder ball 260 is formed on the copper layer 220, this is an artifact of the cross-section view; the solder ball 260 may physically contact the redistribution layer 240 but may in some embodiments not actually be aligned over the copper layer 230.

Figure 2B:
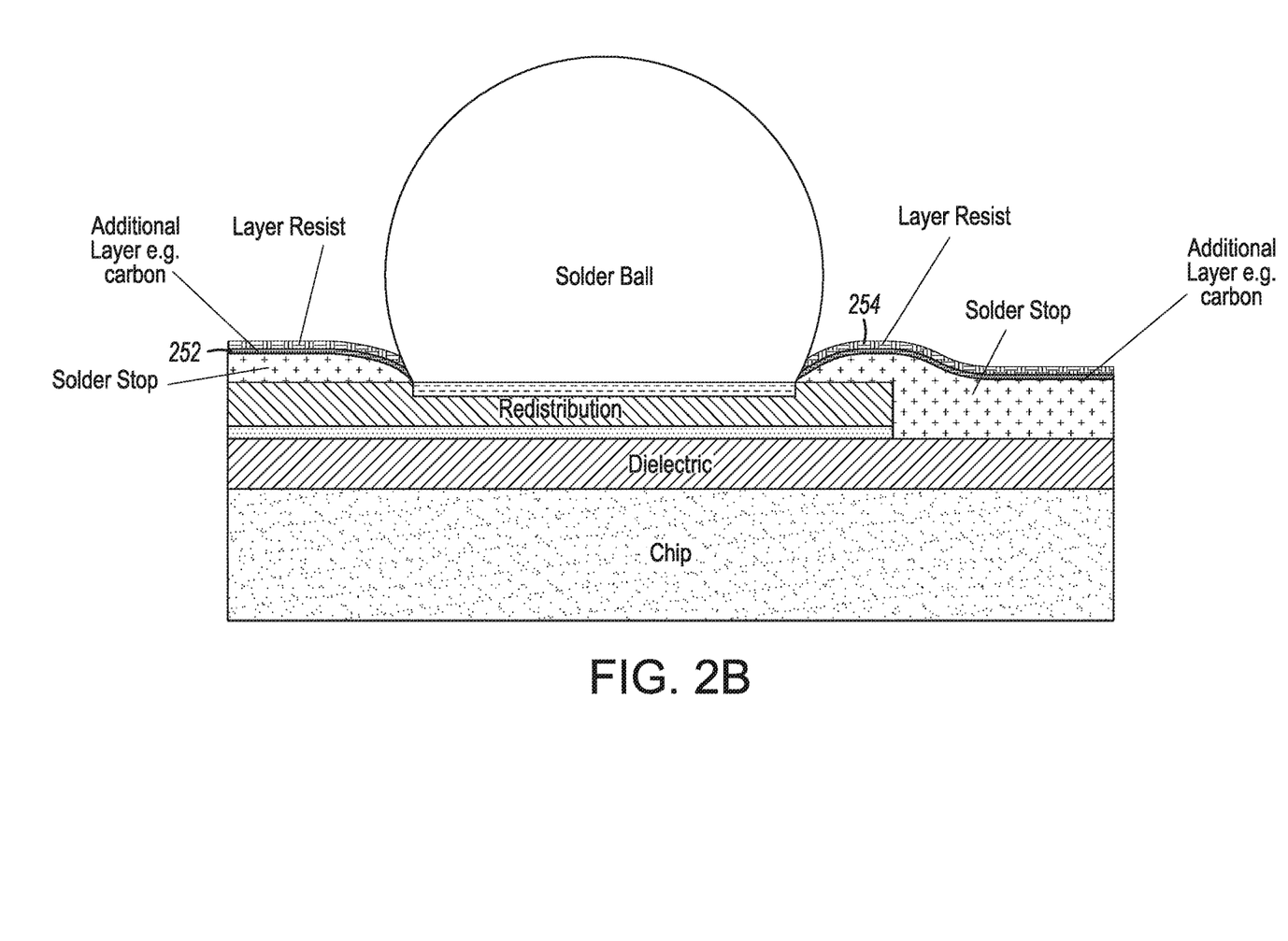

In some embodiments, such as that shown in FIG. 2B, the protective layer 242 may be disposed in an entirely different location than that shown in FIG. 2A. Specifically, as shown in FIG. 2B, rather than the protective layer 242 being disposed between the redistribution layer 240 and the solder stop, the protective layer 252 may be disposed on the solder stop. An additional layer resist 254 may be deposited above the protective layer 252. In this case, as above, after being spun on, the additional layer resist 254 may be patterned by lithography and an opening provided on the protective layer 252 above the redistribution layer. The additional layer resist 254 may provide passivation, and thus may be called a passivation resist. After patterning of the additional layer resist 254, the pad (redistribution layer) may be conditioned, for example as above using a plasma to open up the protective layer 252 in the opening and subsequently to clean the exposed redistribution layer after the openings in the solder stop have been created but before attachment of the solder balls.

Figure 2C:
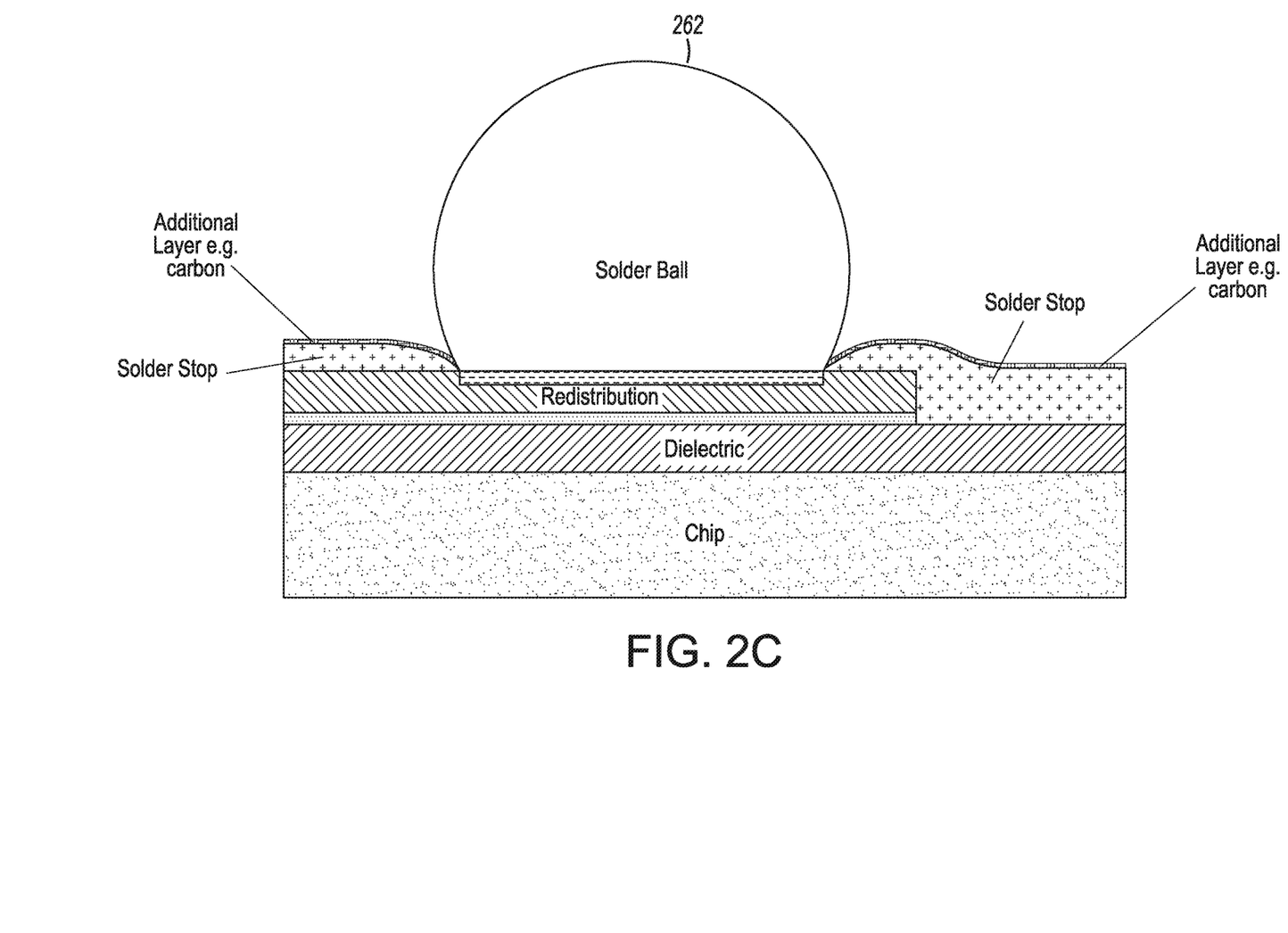
Figure 2D:
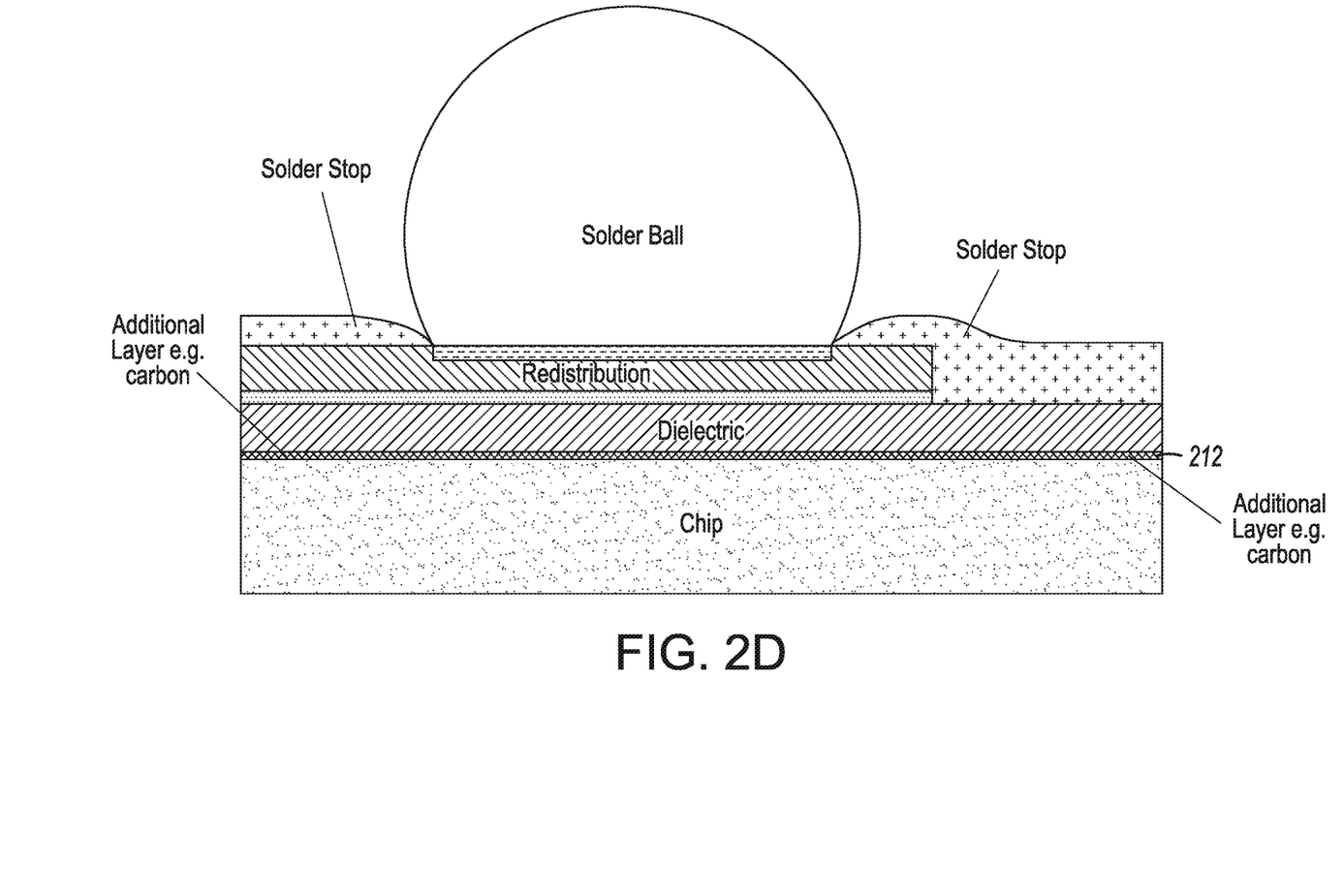

The protective layer 252 may, as shown in FIGS. 2A and 2B, be disposed below an outer layer—the solder stop or the layer resist, respectively. However, in other embodiments, such as that shown in FIG. 2C, the protective layer 262 may be in yet another different location than that shown in FIG. 2A or 2B. Specifically, rather than the protective layer 262 being disposed between the solder stop and the underlying redistribution layer or the solder stop and the overlying layer resist, as shown in FIG. 2C, the protective layer 262 may be disposed on the entire surface of the device before or after attachment of the solder ball. In this case, the protective layer 262 may be the topmost layer, extending over the solder stop but not over or under the solder ball in the final step. If the protective layer 262 is deposited on the solder ball, as the protective layer 262 may be relatively thin, the portion of the protective layer 262 on the solder ball may be eliminated mechanically when the solder ball is attached to a lead or another substrate; the remaining portion of the protective layer 262 may in this case remain intact over the solder stop, however. As above, although solder balls are described, the protective layer 262 may be formed instead or in addition on interconnect elements (to other on- or off-chip circuits) such as landing pads, Cu posts, or wirebond pads.

The protective layer may, as shown in FIGS. 2A-2C, be disposed as an intermediate or outer layer, to protect a copper line and/or redistribution layer. However, in other embodiments, such as that shown in FIG. 2D, the protective layer 212 may be in yet another different location. Specifically, the protective layer 212 may be a passivation layer disposed on the entire surface of the chip prior to deposition of an initial dielectric on the chip. This may aid to eliminate moisture ingress from the chip side thus act as a protectant.

Thus, as shown in FIGS. 2A-2D, the protective layer may be disposed in several different locations as shown in operations 510a-510d. The protective layer may be a passivation layer on the substrate between the substrate and the first dielectric as shown in operation 510a, an interlayer in a dielectric stack in which the protective layer covers a copper line as shown in operation 510b, a final passivation on top of the final dielectric or solder mask and disposed before application of the solder ball (along with a layer resist) as shown in operation 510c or a final passivation layer deposition on top of the final dielectric or solder mask and after application of the solder ball as shown in operation 510d to be broken up during assembly of the device (or printed circuit board forming the device).

The protective layer may, as shown in FIGS. 2A-2D, be limited to a single location in the overall fabrication process to balance fabrication steps and process time with enhanced corrosion resistance. However, in other embodiments, multiple protective layers may be present. For example, in some embodiments, a protective layer may be disposed above of the redistribution layer and another protective layer may be disposed above the solder stop layer. The protective layers may be disposed in the locations shown in FIG. 2A-2D or in other locations, such as covering intermediate copper layer or other layers between the chip and the contact pad formed by the topmost copper layer and/or redistribution layer.

FIGS. 3A-3H illustrate cross-sections of a method of building a device with protection in accordance with some embodiments. The materials and operations shown in FIGS. 3A-3H may be similar to that described above. While the fabrication method shown in FIGS. 3A-3H may result in the same structure as shown in FIGS. 2A-2D, in some embodiments, one or more other layers than those shown may be present or one or more layers may not be present. The resulting structure may be used in various packages (WLB, eWLB, FC, embedded packages or laminate packages) at one or more locations. These locations may include solder balls or solder bumps, as shown above, Cu lines, landing pads, Cu posts, or wirebond pads. The structure may be disposed on a substrate, printed circuits boards (PCB). The protection layer may be used on conformal shielding for laminate packages and modules.

Figure 3A:
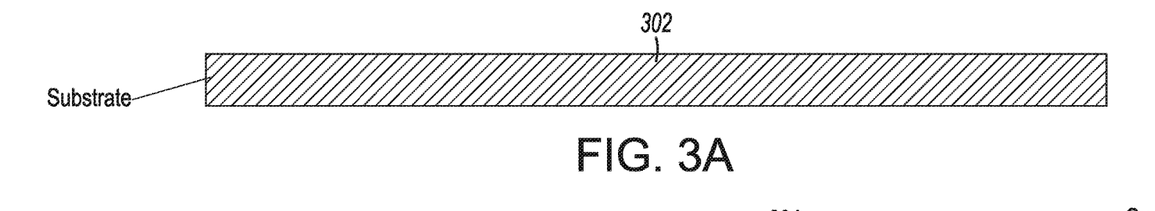
FIGS. 3A-3H illustrate cross-sections of a method of building a device with protection in accordance with some embodiments.
Figure 3B:
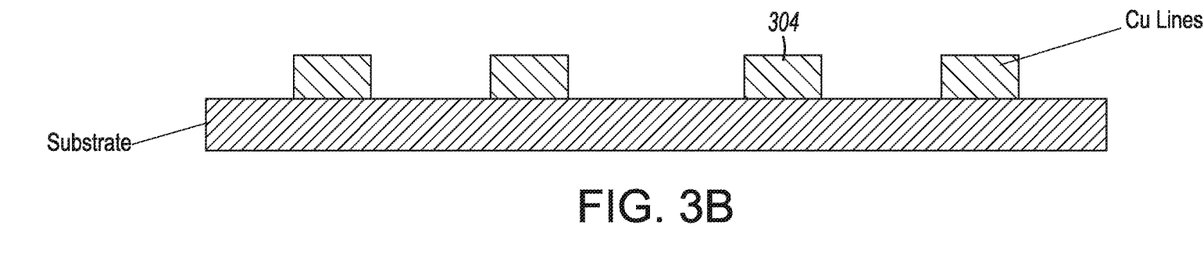

As shown, the method starts out in FIG. 3A with a substrate 302, which may be a semiconductor substrate and/or a mold compound. In some embodiments, Cu lines 304 may be deposited or plated and subsequently patterned on the substrate 302 using lithographic processes, as above. The resulting structure is shown in FIG. 3B. The height of the Cu lines may be 10-15 μm, as above.

Figure 3C:
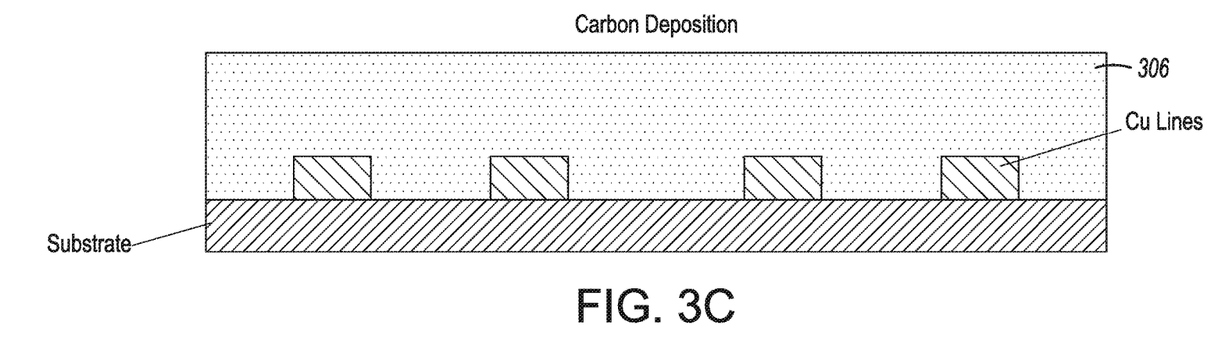
Figure 3D:
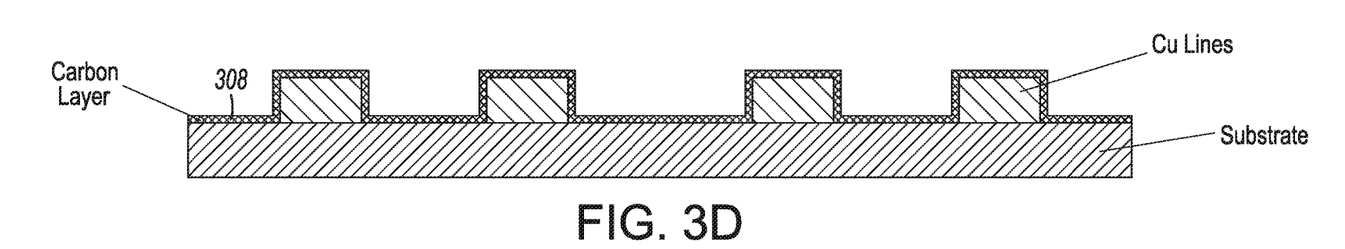

Subsequently, a protection layer 306 may be deposited over the structure including the Cu lines. The structure containing the protection layer is shown in FIG. 3C. The protection layer 306 may then be etched or otherwise thinned to produce a thin carbon (protection) layer 308. The thin protection layer is shown in FIG. 3D and covers both the substrate as well as the CU lines. The thin protection layer may have a thickness of, for example, 1-3 μm.

Figure 3E:
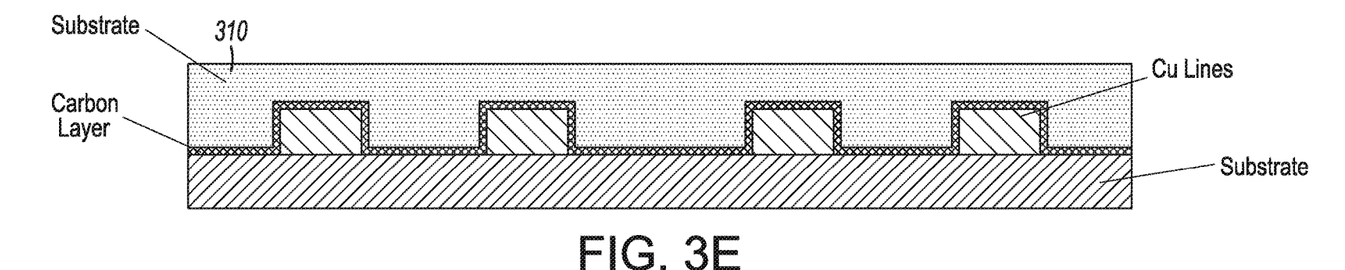

A substrate material may then be deposited on the structure shown in FIG. 3D. The upper substrate 310 may be the same material as the lower substrate, or in some embodiments may be different (such as a different semiconductor). The resulting structure is shown in FIG. 3E.

Figure 3F:
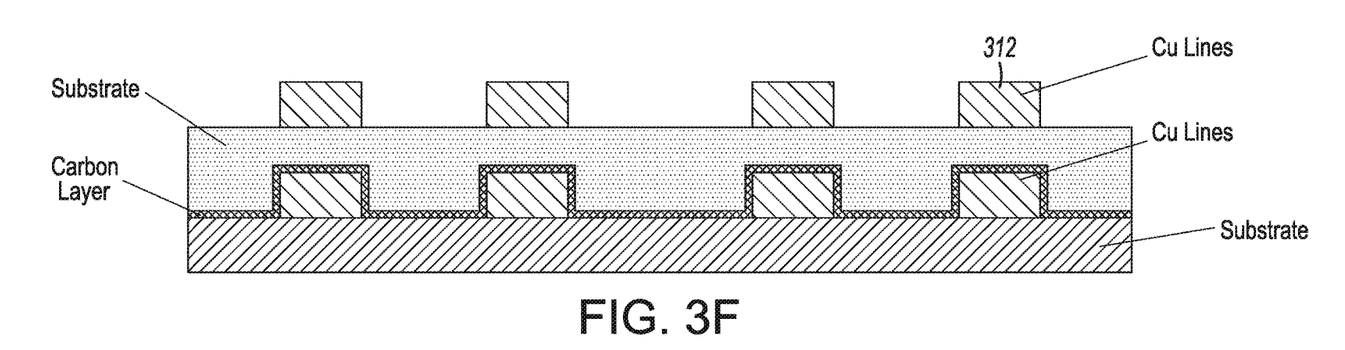
Figure 3G:
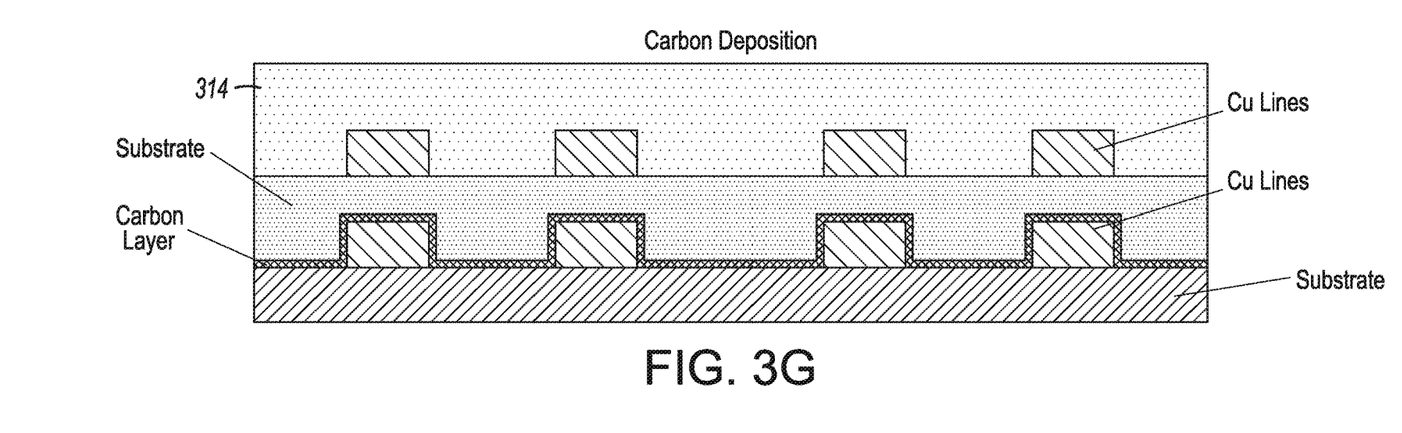
Figure 3H:
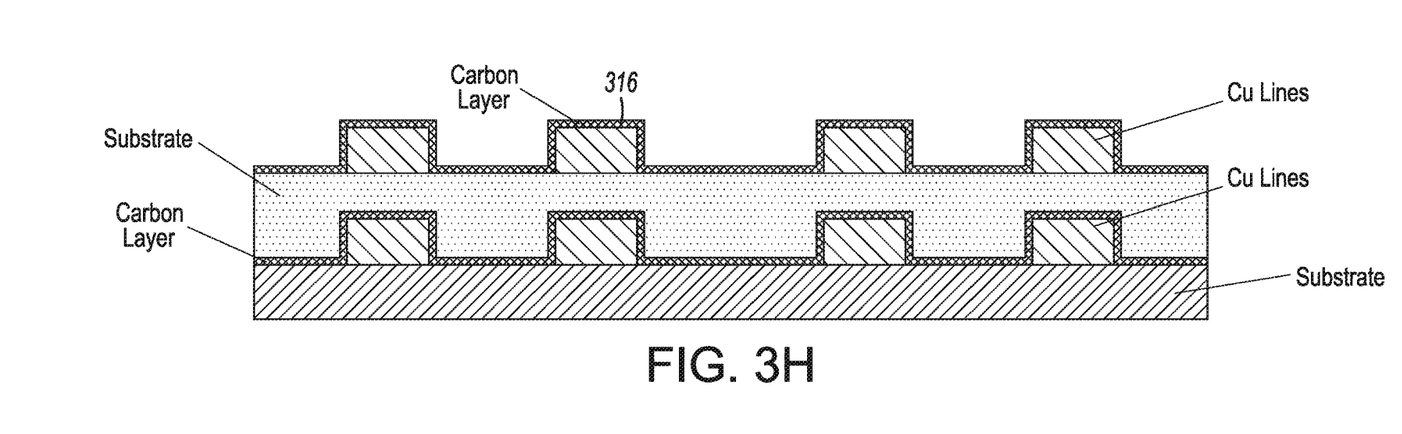

The process operations whose results are shown in FIGS. 3B-3D may then be repeated, as shown in FIGS. 3F-3H. That is, CU lines 312 may be fabricated, as shown in FIG. 3F, a thick protective layer 314 deposited to entirely cover the CU lines, as shown in FIG. 3G, and then the thick protective layer etched (via wet or dry chemical etching) to form a thin protective layer 316 over the CU lines and second substrate, as shown in FIG. 3H. This process can be replicated as many times as desired.

Figure 4:
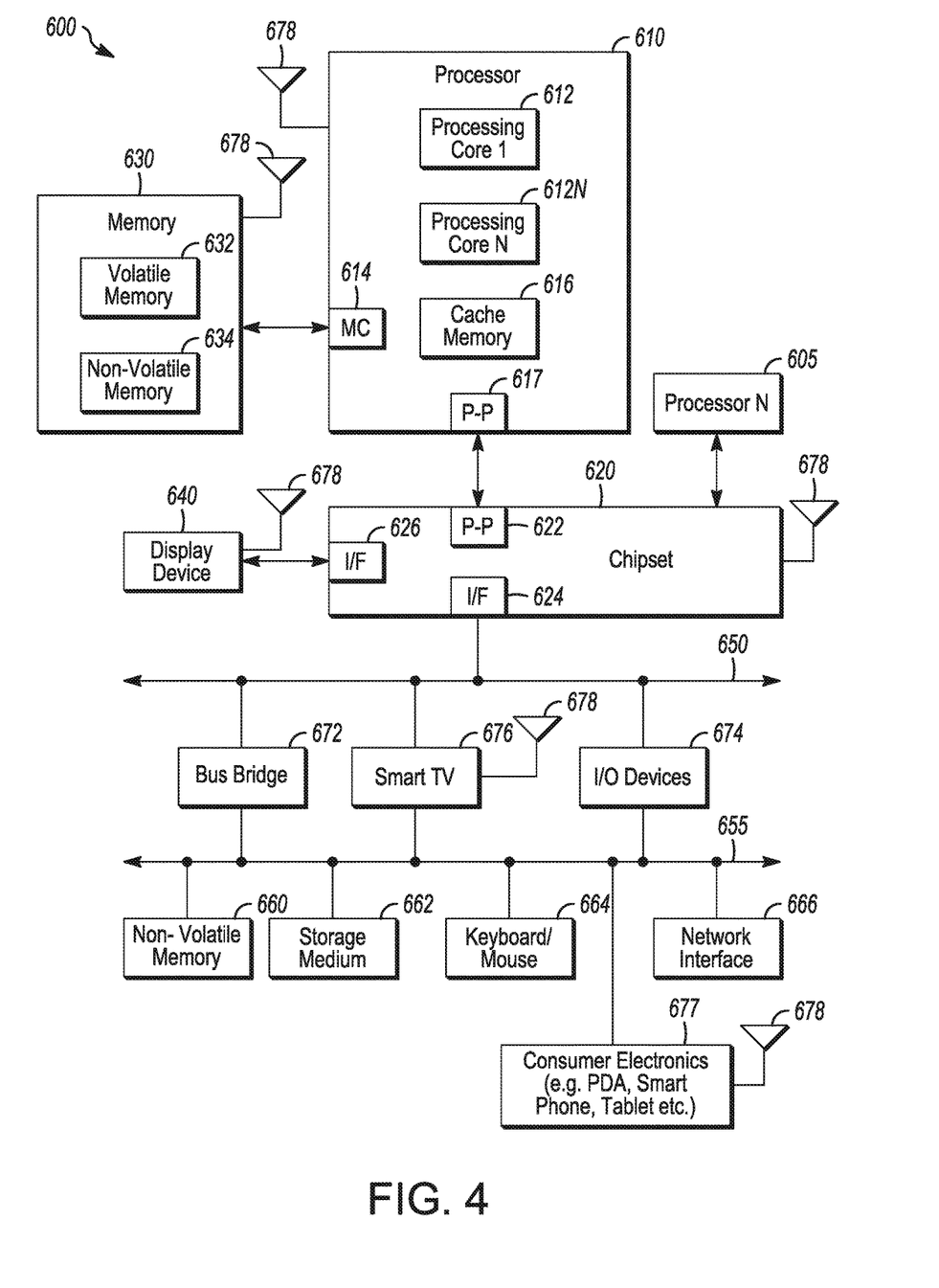
FIG. 4 shows a block diagram of an electronic device with shielding in accordance with some embodiments.

FIG. 4 shows a block diagram of an electronic device with shielding in accordance with some embodiments. FIG. 4 illustrates a system level diagram that includes an electronic device (e.g., system) having a structure and/or formed by the methods described herein. In one embodiment, system 400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 400 is a system on a chip (SOC) system.

In one embodiment, processor 410 has one or more processor cores 412 and 412N, where 412N represents the Nth processor core inside processor 410 where N is a positive integer. In one embodiment, system 400 includes multiple processors including 410 and 405, where processor 405 has logic similar or identical to the logic of processor 410. In some embodiments, processing core 412 includes, but is not limited to, pre-fetch logic to fetch instructions, decode logic to decode the instructions, execution logic to execute instructions and the like. In some embodiments, processor 410 has a cache memory 416 to cache instructions and/or data for system 400. Cache memory 416 may be organized into a hierarchal structure including one or more levels of cache memory.

In some embodiments, processor 410 includes a memory controller 414, which is operable to perform functions that enable the processor 410 to access and communicate with memory 430 that includes a volatile memory 432 and/or a non-volatile memory 434. In some embodiments, processor 410 is coupled with memory 430 and chipset 420. Processor 410 may also be coupled to a wireless antenna 478 to communicate with any device configured to transmit and/or receive wireless signals. In one embodiment, an interface for wireless antenna 478 operates in accordance with the 4GPP and/or IEEE 802.11 standard protocol, Home Plug AV (HPAV), Ultra Wide Band (UWB), Bluetooth, WiMax, or any form of wireless communication protocol.

In some embodiments, volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 434 includes, but is not limited to, flash memory, phase change memory (PCM), read-only memory (ROM), electrically erasable programmable read-only memory (EEPROM), or any other type of non-volatile memory device.

Memory 430 stores information and instructions to be executed by processor 410. In one embodiment, memory 430 may also store temporary variables or other intermediate information while processor 410 is executing instructions. In the illustrated embodiment, chipset 420 connects with processor 410 via Point-to-Point (PtP or P-P) interfaces 417 and 422. Chipset 420 enables processor 410 to connect to other elements in system 400. In some embodiments of the example system, interfaces 417 and 422 operate in accordance with a PtP communication protocol such as the Intel® QuickPath Interconnect (QPI) or the like. In other embodiments, a different interconnect may be used.

In some embodiments, chipset 420 is operable to communicate with processor 410, 405N, display device 440, and other devices, including a bus bridge 472, a smart TV 476, I/O devices 474, nonvolatile memory 460, a storage medium (such as one or more mass storage devices) 462, a keyboard/mouse 464, a network interface 466, and various forms of consumer electronics 477 (such as a PDA, smart phone, tablet etc.), etc. In one embodiment, chipset 420 couples with these devices through an interface 424. Chipset 420 may also be coupled to a wireless antenna 478 to communicate with any device configured to transmit and/or receive wireless signals.

Chipset 420 connects to display device 440 via interface 426. Display 440 may be, for example, a liquid crystal display (LCD), a light emitting diode (LED) array, an organic light emitting diode (OLED) array, or any other form of visual display device. In some embodiments of the example system, processor 410 and chipset 420 are merged into a single SOC. In addition, chipset 420 connects to one or more buses 450 and 455 that interconnect various system elements, such as I/O devices 474, nonvolatile memory 460, storage medium 462, a keyboard/mouse 464, and network interface 466. Buses 450 and 455 may be interconnected together via a bus bridge 472.

In one embodiment, mass storage device 462 includes, but is not limited to, a solid state drive, a hard disk drive, a universal serial bus flash memory drive, or any other form of computer data storage medium. In one embodiment, network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the 4GPP standard and its related family, the IEEE 802.11 standard and its related family, Home Plug AV (HPAV), Ultra Wide Band (UWB), Bluetooth. WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into processor core 412.

ADDITIONAL NOTES AND EXAMPLES

Example 1 is a device comprising: a substrate comprising at least one of a semiconductor or mold compound; a first dielectric disposed on substrate; a copper layer plated in an opening in the first dielectric; a solder resist layer above the copper layer; a solder ball in an opening in the solder resist layer, the solder ball in conductive contact with the copper layer; and a non-conductive carbon layer on the substrate, the non-conductive carbon layer configured to act as a diffusion barrier to moisture for the copper layer.

In Example 2, the subject matter of Example 1 includes, wherein the carbon layer is disposed on the substrate below the first dielectric.

In Example 3, the subject matter of Examples 1-2 includes, wherein the carbon layer is disposed between the solder resist layer and the first dielectric.

In Example 4, the subject matter of Examples 1-3 includes, wherein the carbon layer is disposed on the solder resist layer.

In Example 5, the subject matter of Example 4 includes, wherein the carbon layer is further disposed on at least one of the solder ball or an interconnect element.

In Example 6, the subject matter of Examples 4-5 includes, wherein the carbon layer is adjacent to the solder ball and the solder ball is free from the carbon layer.

In Example 7, the subject matter of Examples 1-6 includes, a redistribution layer disposed on and in electrical contact with the copper layer, wherein the solder ball is in physical contact with the redistribution layer and does not overlie the copper layer, and the carbon layer is disposed between the solder resist layer and the redistribution layer and is not disposed between the solder ball and the redistribution layer.

In Example 8, the subject matter of Examples 1-7 includes, a second non-conductive carbon layer on the substrate configured to act as another diffusion barrier to moisture for the copper layer, the second non-conductive carbon layer disposed on a same side of the copper layer as the non-conductive carbon layer, the non-conductive carbon layer and second non-conductive carbon layer separated by at least one dielectric.

In Example 9, the subject matter of Examples 1-8 includes, a second non-conductive carbon layer on the substrate configured to act as another diffusion barrier to moisture for the copper layer, the second non-conductive carbon layer disposed on an opposite side of the copper layer as the non-conductive carbon layer, the non-conductive carbon layer and second non-conductive carbon layer separated by at least one dielectric.

In Example 10, the subject matter of Examples 1-9 includes, wherein the device is disposed in one of a Wafer Level Ball Grid Array (WLB), an Embedded Wafer Level Ball Grid Array (eWLB), Flip-Chip (FC) bonded or embedded packages.

Example 11 is a method for protecting a copper layer from, the method comprising: spinning on a first dielectric on a substrate comprising at least one of a semiconductor or mold compound; patterning the first dielectric to provide an opening in the first dielectric; plating a copper layer in the opening in the first dielectric; spinning on a solder resist layer above the copper layer; depositing a non-conductive carbon layer on the substrate, the non-conductive carbon layer acting as a diffusion barrier to moisture for the copper layer; plating a redistribution layer on the copper layer, the solder ball in physical contact with the redistribution layer; patterning the solder resist layer to provide an opening in the solder resist layer; and attaching a solder ball in the opening in the solder resist layer, the solder ball in conductive contact with the copper layer.

In Example 12, the subject matter of Example 11 includes, wherein the carbon layer is disposed on the substrate below the first dielectric.

In Example 13, the subject matter of Examples 11-12 includes, wherein the carbon layer is disposed between the solder resist layer and the first dielectric.

In Example 14, the subject matter of Examples 11-13 includes, wherein the carbon layer is disposed on the solder resist layer.

In Example 15, the subject matter of Example 14 includes, wherein the carbon layer is further disposed on at least one of the solder ball or an interconnect element.

In Example 16, the subject matter of Examples 14-15 includes, wherein the carbon layer is not disposed on the solder ball.

In Example 17, the subject matter of Examples 11-16 includes, depositing a second non-conductive carbon layer on the substrate, the second non-conductive carbon layer acting as another diffusion barrier to moisture for the copper layer, the second non-conductive carbon layer disposed on a same side of the copper layer as the non-conductive carbon layer, the non-conductive carbon layer and second non-conductive carbon layer separated by the solder resist layer.

Example 18 is a printed circuit board (PCB) comprising: a substrate comprising at least one of a semiconductor or mold compound; a first dielectric disposed on substrate; a copper layer plated in an opening in the first dielectric; a redistribution layer plated on the copper layer; a solder resist layer disposed above the copper layer; a solder ball disposed in an opening in the solder resist layer, the solder ball in conductive contact with the copper layer and in physical contact with the redistribution layer; and a non-conductive carbon layer disposed on and in contact with one of the redistribution layer or the solder resist layer, the carbon layer configured to act as a diffusion barrier to moisture for the copper layer, the carbon layer being substantially thinner than the copper layer.

In Example 19, the subject matter of Example 18 includes, wherein the carbon layer is further disposed on the solder ball.

In Example 20, the subject matter of Examples 18-19 includes, a second non-conductive carbon layer configured to act as another diffusion barrier to moisture for the copper layer, the second non-conductive carbon layer disposed on the other of the redistribution layer or the solder resist layer.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising." when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]." depending on the context.

The invention claimed is:

1. A device comprising:
a substrate comprising at least one of a semiconductor or mold compound;
a first dielectric disposed on substrate;
a copper layer plated in an opening in the first dielectric;
a solder resist layer above the copper layer;
a solder ball in an opening in the solder resist layer, the solder ball in conductive contact with the copper layer; and
a non-conductive carbon layer on the substrate, the non-conductive carbon layer formed from carbon rather than a carbon compound and configured to act as a diffusion barrier to moisture for the copper layer.

2. The device of claim 1, wherein the carbon layer is disposed on the substrate below the first dielectric.

3. The device of claim 1, wherein the carbon layer is disposed between the solder resist layer and the first dielectric.

4. The device of claim 1, wherein the carbon layer is disposed on the solder resist layer.

5. The device of claim 4, wherein the carbon layer is further disposed on at least one of the solder ball or an interconnect element.

6. The device of claim 4, wherein the carbon layer is adjacent to the solder ball and the solder ball is free from the carbon layer.

7. The device of claim 1, further comprising:
a redistribution layer disposed on and in electrical contact with the copper layer,
wherein the solder ball is in physical contact with the redistribution layer and does not overlie the copper layer, and the carbon layer is disposed between the solder resist layer and the redistribution layer and is not disposed between the solder ball and the redistribution layer.

8. The device of claim 1, further comprising a second non-conductive carbon layer on the substrate configured to act as another diffusion barrier to moisture for the copper layer, the second non-conductive carbon layer disposed on a same side of the copper layer as the non-conductive carbon layer, the non-conductive carbon layer and second non-conductive carbon layer separated by at least one dielectric.

9. The device of claim 1, further comprising a second non-conductive carbon layer on the substrate configured to act as another diffusion barrier to moisture for the copper layer, the second non-conductive carbon layer disposed on an opposite side of the copper layer as the non-conductive carbon layer, the non-conductive carbon layer and second non-conductive carbon layer separated by at least one dielectric.

10. The device of claim 1, wherein the device is disposed in one of a Wafer Level Ball Grid Array (WLB), an Embedded Wafer Level Ball Grid Array (eWLB), Flip-Chip (FC) bonded or embedded packages.

11. A method for protecting a copper layer from, the method comprising:
spinning on a first dielectric on a substrate comprising at least one of a semiconductor or mold compound;
patterning the first dielectric to provide an opening in the first dielectric;
plating a copper layer in the opening in the first dielectric;
plating a redistribution layer on the copper layer;
spinning on and patterning the solder resist layer to provide an opening in the solder resist layer to the redistribution layer; and
attaching a solder ball in the opening in the solder resist layer, the solder ball in physical contact with the redistribution layer and in conductive contact with the copper layer,
wherein a non-conductive carbon layer that provides a diffusion barrier to moisture for the copper layer is deposited on the substrate,
the non-conductive carbon layer is formed from carbon rather than a carbon compound.

12. The method of claim 11, wherein the carbon layer is disposed on the substrate below the first dielectric.

13. The method of claim 11, wherein the carbon layer is disposed between the solder resist layer and the first dielectric.

14. The method of claim 11, wherein the carbon layer is disposed on the solder resist layer.

15. The method of claim 14, wherein the carbon layer is further disposed on at least one of the solder ball or an interconnect element.

16. The method of claim 14, wherein the carbon layer is not disposed on the solder ball.

17. The method of claim 11, further comprising:
depositing a second non-conductive carbon layer on the substrate, the second non-conductive carbon layer acting as another diffusion barrier to moisture for the copper layer, the second non-conductive carbon layer disposed on a same side of the copper layer as the non-conductive carbon layer, the non-conductive carbon layer and second non-conductive carbon layer separated by the solder resist layer.

18. A printed circuit board (PCB) comprising:
a substrate comprising at least one of a semiconductor or mold compound;
a first dielectric disposed on substrate;
a copper layer plated in an opening in the first dielectric;
a redistribution layer plated on the copper layer;
a solder resist layer disposed above the copper layer;
a solder ball disposed in an opening in the solder resist layer, the solder ball in conductive contact with the copper layer and in physical contact with the redistribution layer; and
a non-conductive carbon layer disposed on and in contact with one of the redistribution layer or the solder resist layer, the carbon layer configured to act as a diffusion barrier to moisture for the copper layer, the carbon layer being substantially thinner than the copper layer, the carbon layer is further disposed on the solder ball.

19. The PCB of claim 18, further comprising a second non-conductive carbon layer configured to act as another diffusion barrier to moisture for the copper layer, the second non-conductive carbon layer disposed on the other of the redistribution layer or the solder resist layer.

20. The device of claim 4, wherein the carbon layer is further disposed on the solder ball.

* * * * *

UNITED STATES PATENT AND TRADEMARK OFFICE
CERTIFICATE OF CORRECTION

PATENT NO. : 10,546,826 B2
APPLICATION NO. : 16/025575
DATED : January 28, 2020
INVENTOR(S) : Georg Seidemann

Page 1 of 1

It is certified that error appears in the above-identified patent and that said Letters Patent is hereby corrected as shown below:

In the Claims

In Column 12, Line 63, in Claim 11, after "substrate,", insert --and--

Signed and Sealed this
Twenty-second Day of December, 2020

Andrei Iancu
*Director of the United States Patent and Trademark Office*